United States Patent
Rikitake (10) Patent No.: US 7,882,313 B2
(45) Date of Patent: Feb. 1, 2011

(54) DATA RECORDING SYSTEM

(75) Inventor: Nobuhiro Rikitake, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 560 days.

(21) Appl. No.: 11/947,497

(22) Filed: Nov. 29, 2007

(65) Prior Publication Data

US 2008/0183952 A1    Jul. 31, 2008

(30) Foreign Application Priority Data

Jan. 30, 2007    (JP)    ............................. 2007-020063

(51) Int. Cl.
*G06F 12/00* (2006.01)
(52) U.S. Cl. ...................... 711/156; 711/103
(58) Field of Classification Search .................. 711/156, 711/103
See application file for complete search history.

(56) References Cited

U.S. PATENT DOCUMENTS

| | | | |
|---|---|---|---|
| 5,887,046 A | * | 3/1999 | Bromley et al. ............... 377/39 |
| 6,539,453 B1 | * | 3/2003 | Guterman .................... 711/103 |
| 7,721,006 B2 | * | 5/2010 | Morrow ......................... 710/5 |
| 2008/0126679 A1 | | 5/2008 | Philipps |

FOREIGN PATENT DOCUMENTS

| | | |
|---|---|---|
| DE | 102004034042 | 2/2006 |
| JP | 07-281842 | 10/1995 |
| JP | 08-125914 | 5/1996 |
| JP | 2000-339506 | 12/2000 |

OTHER PUBLICATIONS

The State Intellectual Property Office of China; Office Action mailed Jun. 21, 2010, in connection with correspondent patent application No. CN 200710198854.5. English-language translation provided.

* cited by examiner

*Primary Examiner*—Stephen C Elmore
(74) *Attorney, Agent, or Firm*—Fujitsu Patent Center (57) ABSTRACT

A data recording system comprises a first memory, a counting unit for counting the number of data writes to the first memory, and an alarm unit for outputting an alarm if the number of data writes to the first memory reaches a first threshold value. The counting unit writes data of the number of writes, which represents the number of data writes to the first memory, to the first memory or a second memory. The alarm unit outputs an alarm based on the data of the number of writes, which is written to the first or the second memory.

7 Claims, 10 Drawing Sheets

| ADDRESS | CAPACITY | INTENDED USE |
|---|---|---|
| 0x00000000 - 0x00FFFFFF | 16Mbyte | BOOT PROGRAM |
| 0x01000000 - 0x06FFFFFF | 100Mbyte | TEST TOOL |
| 0x20000000 - 0x2FFFFFFF | 256Mbyte | APPLICATION |
| 0x30000000 - 0x4FFFFFFF | 512Mbyte | DATABASE |
| 0x50000000 - 0x5FFFFFFF | 256Mbyte | PM DATA |
| 0x60000000 - 0xFFFFFFFF | | Reserved(FOR FUTURE EXTENSION) |
| | | |

DATA RECORDING SYSTEM

BACKGROUND OF THE INVENTION

1. Field of the Invention

The present invention relates to a data recording system that uses a memory having a limitation on the number of writes.

2. Description of the Related Art

Memories for saving data are in widespread use in a variety of fields. Especially, the capacities of nonvolatile semiconductor memories (such as a flash memory, an EEPROM, a PROM, etc.) have been increased, and their intended uses have expanded in recent years. Semiconductor memories are normally superior in resistance to vibration, and low power consumption compared with other nonvolatile memories such as a magnetic disk, etc.

However, a limit number of writes (the number of erase/write cycles) of a nonvolatile semiconductor memory is normally small compared with a magnetic disk, etc. For this reason, the number of writes of a nonvolatile semiconductor memory can reach the limit number if the data of the memory is frequently updated for a long period. By way of example, if the limit number of writes is 100,000, a nonvolatile semiconductor memory must be replaced after approximately four years use in a system in which the status information of a network is written to the nonvolatile semiconductor memory at time intervals of 15 minutes.

Patent Documents 1 to 3 recite the techniques for extending the lifetime of a nonvolatile memory. Namely, Patent Document 1 (Japanese Published Unexamined Patent Application No. 2000-339506) recites the procedures for writing data to a nonvolatile memory only if the obtained data exceeds a predetermined threshold value in a management system that saves data representing the state of an image forming apparatus. Patent Document 2 (Japanese Published Unexamined Patent Application No. H8-125914) recites the configuration in which a location to be written is switched to another area within a nonvolatile memory if the number of writes to one block of the memory exceeds a predetermined number. Patent Document 3 (Japanese Published Unexamined Patent Application No. H7-281842) recites the configuration in which new data is written to a ferroelectric memory if the number of writes to a flash memory exceeds a predetermined number in a storage device having the flash memory and the ferroelectric memory.

However, the above described conventional techniques have problems to be overcome. Namely, the configuration recited in Patent Document 1 cannot be adopted for a system that requires entire data to be stored, because part of collected data is discarded without being saved in a memory. With the configuration recited in Patent Document 2, the capacity of a memory must be made large, leading to an increase in the cost. Additionally, with the configuration recited in Patent Document 3, the lifetime of a flash memory itself is not extended.

SUMMARY OF THE INVENTION

An object of the present invention is to extend the lifetime of a memory with a low-cost configuration in a data recording system.

The data recording system according to the present invention comprises a first memory, a counting unit for counting the number of data writes to the first memory, and an alarm unit for outputting an alarm if the number of data writes to the first memory reaches a first threshold value. The counting unit writes data of the number of writes, which represents the number of data writes to the first memory, to the first memory or a second memory. The alarm unit outputs an alarm based on the data of the number of writes, which is written to the first or the second memory.

In the above described configuration, an alarm is output if the number of data writes to the first memory exceeds a threshold value. Therefore, the need for replacing the first memory can be surely recognized, leading to the enhancement of the reliability of the data recording system. Additionally, the data of the number of writes is not recorded each time a data write to the first memory occurs, but recorded each time a predetermined condition is satisfied. Namely, the number of times that the data of the number of writes is written to the first or the second memory is reduced. Accordingly, the lifetime of the first memory can be extended in the configuration in which the data of the number of writes is written to the first memory. In the meantime, an alarm can be output without using the first memory in the configuration in which the data of the number of writes is written to the second memory.

The data recording system having the above described configuration may further comprise a write control unit for writing, to a third memory, data to be written to the first memory if the number of data writes to the first memory reaches a second threshold value. With this configuration, data stored in the first memory can be protected.

A data recording system according to another embodiment of the present invention comprises a first memory, a second memory the capacity of which is smaller than the first memory, a counting unit for counting the number of data writes to the second memory, and a transfer unit for transferring data stored in the second memory to the first memory each time a predetermined number of data writes is made to the second memory.

In the above described configuration, the number of data writes to the first memory is reduced, thereby extending the lifetime of the first memory. Note that the lifetime of the second memory is not extended with this configuration. However, since the capacity of the second memory is small compared with the first memory, cost required for its replacement is low.

According to the present invention, the lifetime of a memory can be extended with a low-cost configuration in a data recording system.

DESCRIPTION OF THE PREFERRED EMBODIMENTS

Figure 1:
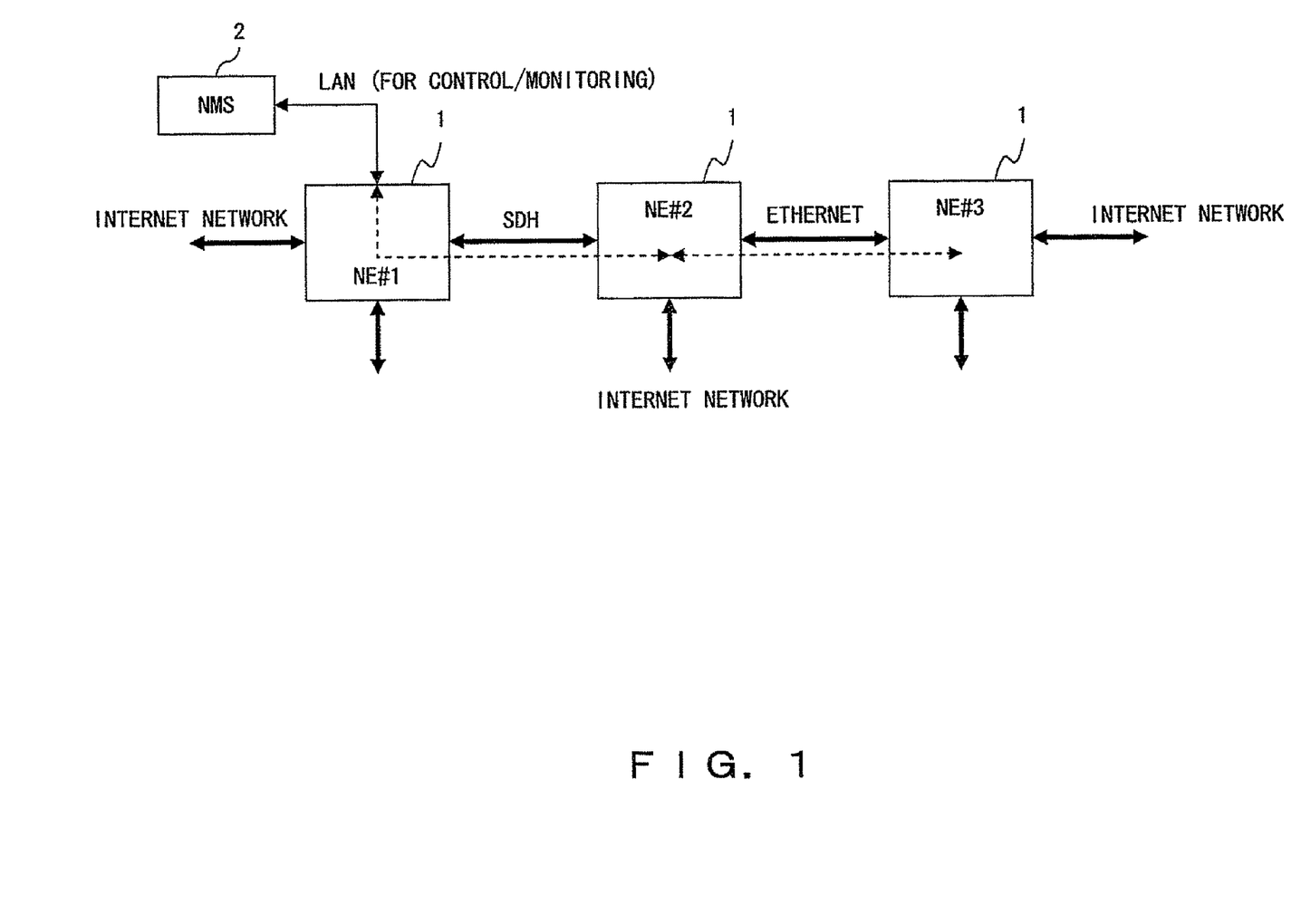
FIG. 1 shows a configuration of a network in which a data recording system according to the present invention is used.

FIG. 1 shows a configuration of a network in which a data recording system according to the present invention is used. In FIG. 1, each of network devices (NEs) 1 is a backbone transmitting device, and connected to the Internet in this example. Each of the network devices 1 is connected to one or a plurality of other network devices 1. In this example, the network devices are connected with SDH (Synchronous Digital Hierarchy), SONET (Synchronous Optical Network), or Ethernet (registered trademark).

A network management system (NMS) 2 manages the state of the network by transmitting/receiving data about the control/monitoring of a communication state to/from each of the network devices 1. In this example, the network management system 2 is connected to a predetermined network device 1 via a LAN.

Figure 2:
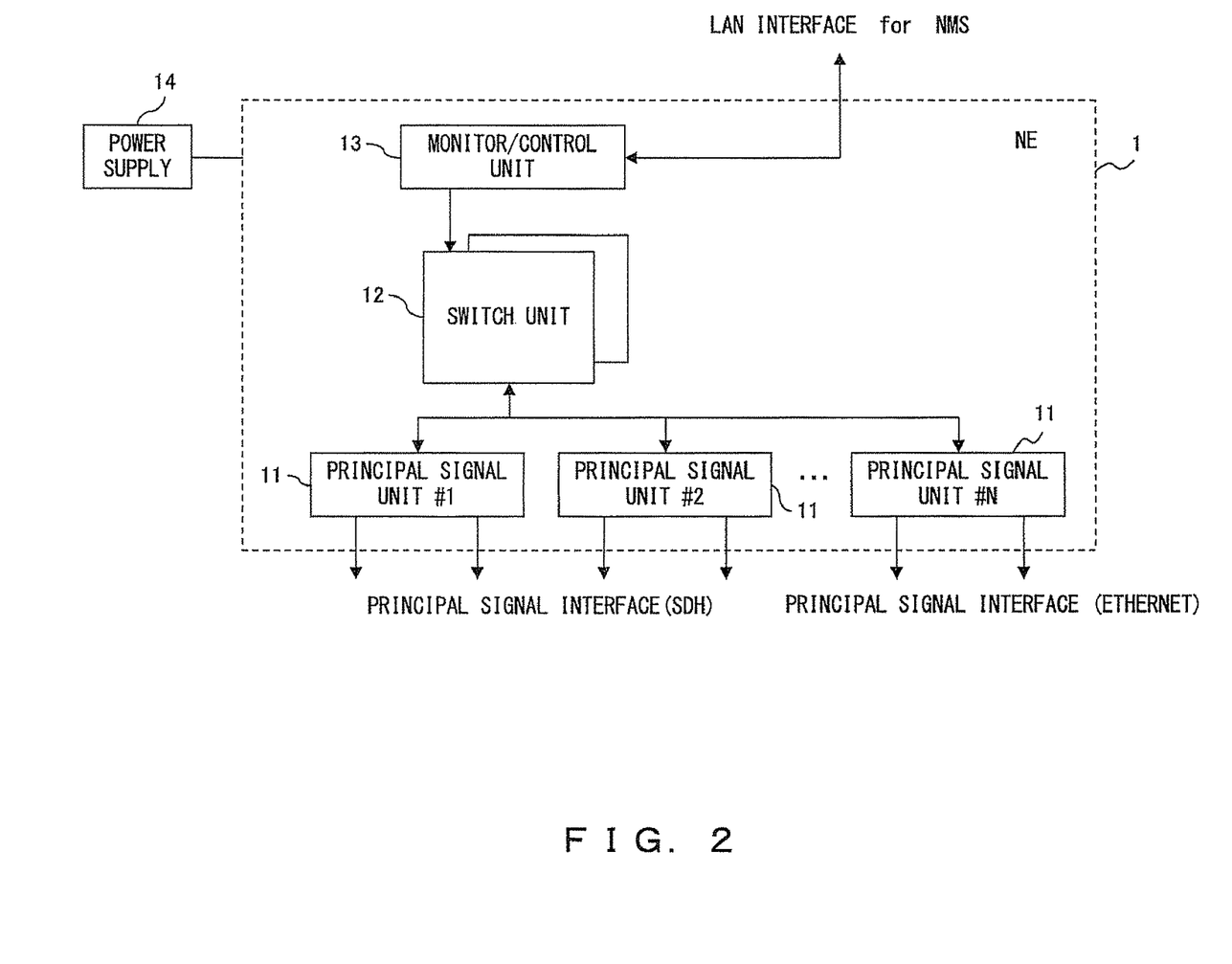
FIG. 2 shows a configuration of a network device.

FIG. 2 shows a configuration of a network device 1. In FIG. 2, each of principal signal units 11 provides an interface for its corresponding communication method (SDH, Ethernet, etc.). Each of switch units 12 performs a switching process for corresponding communication method (SDH, Layer 2, TDM, etc.). A monitor/control unit 13 monitors/controls the operations of the network devices 1, and outputs an alarm when necessary. Additionally, the monitor/control unit 13 has an interface for transmitting/receiving data to/from the network management system 2. Power is supplied from a power supply 14 to these units 11 to 13. Also clock signals are given to the units 11 to 13.

Each of the units 11 to 13 comprises a CPU, a working RAM, and a large-capacity memory. A corresponding function is provided by executing a program stored in the large-capacity memory.

In the embodiment shown in FIGS. 1 and 2, the present invention relates to, for example, the procedures and the configuration for recording data to the large-capacity memory comprised by one of or each of the units 11 to 13.

Figure 3:
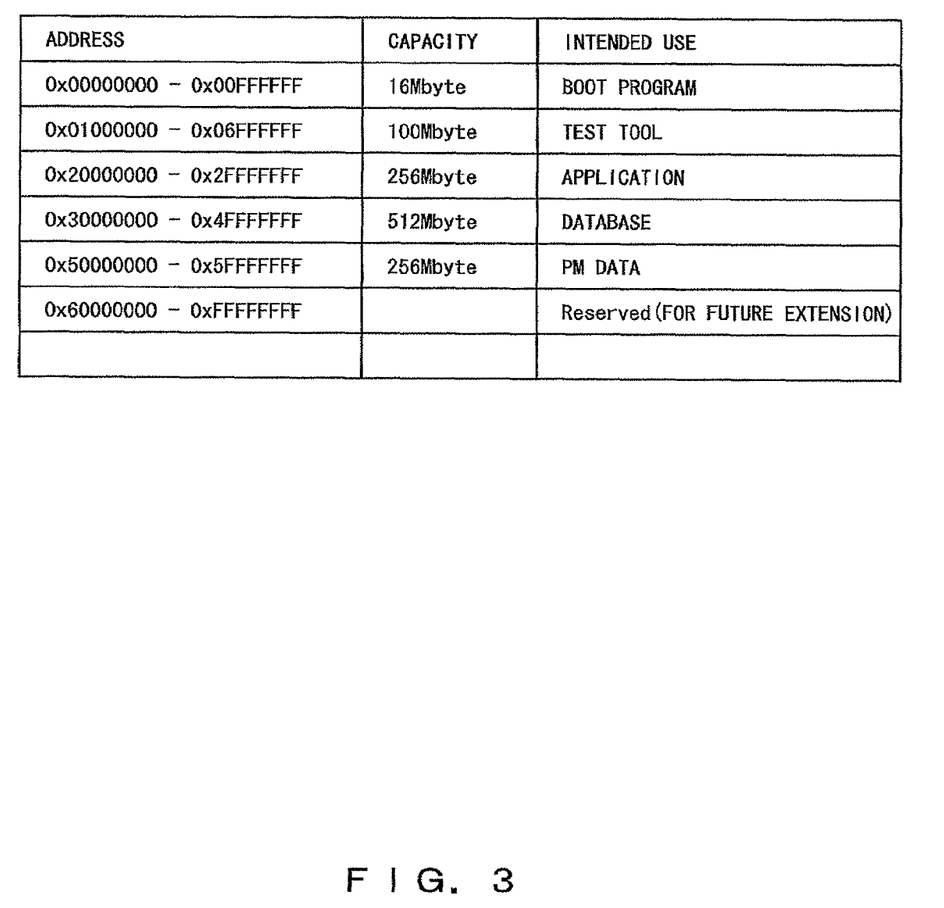
FIG. 3 exemplifies a map of a large-capacity memory comprised by each unit.

FIG. 3 exemplifies a map of the large-capacity memory comprised by each of the units. Assume that this large-capacity memory is a rewritable nonvolatile memory, and its capacity is 4 GB. In the example shown in FIG. 3, a boot program, a test tool program, and an application program a restored in predetermined areas of the large-capacity memory. Furthermore, a database area (addressed from 0x30000000 to 0x4FFFFFFF), and a PM data area (addressed from 0x50000000 to 0x5FFFFFFF) are provided in this large-capacity memory. Various types of databases are prepared in the database area, whereas performance monitor data (hereinafter abbreviated to "PM data") is recorded to the PM data area.

The PM data is data that represents communication performance, and includes, for example, the number of transmitted packets, the number of received packets, the number of discarded packets, an error rate, etc. Additionally, the PM data is collected at predetermined time intervals, and written to the PM data area. Here, assuming that the PM data is collected at time intervals of 15 minutes, 96 data writes are made to the PM data area per day (namely, approximately 35,000 data writes per year).

First Embodiment

Figure 4:
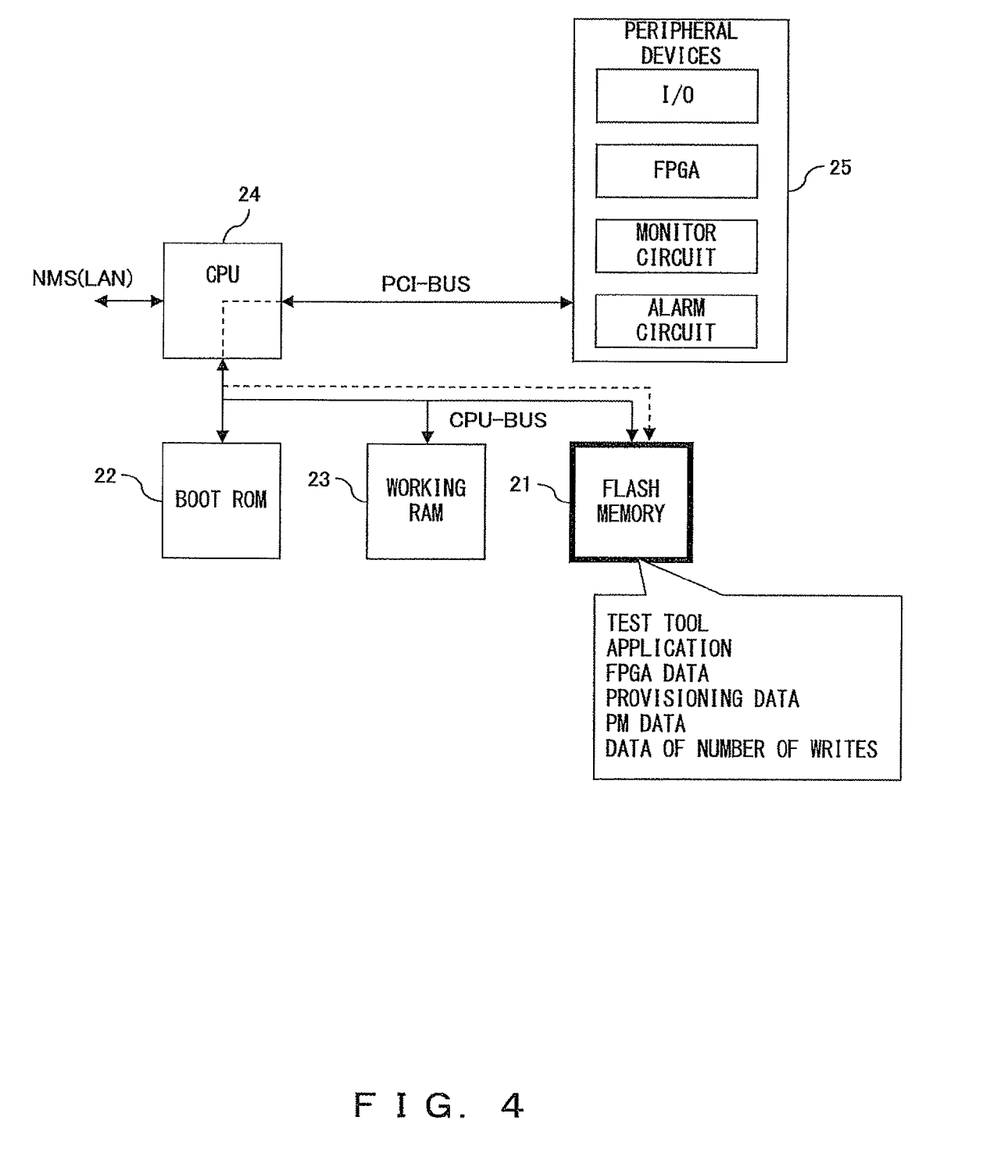
FIG. 4 is a block diagram showing a memory and its peripheral circuits of a data recording system according to a first embodiment.

FIG. 4 is a block diagram showing a memory and its peripheral circuits. In this figure, the flash memory 21 is equivalent to the above described large-capacity memory, and is a nonvolatile memory. Although the flash memory 21 is a rewritable memory, its number of writes is limited. The limit number of writes (namely, a guaranteed maximum number of writes or the number of erase/write cycles) of the flash memory 21 is assumed to be 100,000 in this embodiment.

In the example shown in FIG. 4, a test tool program, an application program, FPGA data, provisioning data, PM data, and data of the number of writes (number-of-writes data) are stored in the flash memory 21. Although the FPGA data and the provisioning data are updated when necessary, their update frequencies are low. In the meantime, the PM data is written with high frequency since it is collected periodically as described above. The data of the number of writes represents the number of data writes to the flash memory 21, and will be described in detail later.

A boot ROM 22 stores a boot program. A working RAM 23 is a volatile memory such as a DRAM, etc., and used as a working area of a CPU 24. The CPU 24 is started up by the boot program stored in the boot ROM 22. The CPU 24 provides a corresponding function by executing a program stored in the flash memory 21. The CPU 24 is connected to the flash memory 21, the boot ROM 22, and the working RAM 23 via a CPU bus.

Peripheral devices 25 are, for example, an I/O device, an FPGA (Field Programmable Gate Array), a monitor circuit, an alarm circuit, etc., and operate in accordance with an instruction of the CPU 24. When configuring, for example, a principal signal unit #N, the FPGA includes a function to interface to another network device 1 with Ethernet, and the PM data is calculated and accumulated according to the process of each packet. The monitor circuit collects the PM data. The CPU 24 and the peripheral devices 25 are connected, for example, via a PCI bus.

In the system having the above described configuration, the CPU 24 writes the PM data, which is collected by using the monitor circuit, to the PM data area of the flash memory 21. Additionally, the CPU 24 transmits data, which is stored in the PM data area of the flash memory 21, to the network management system 2 at predetermined time intervals. The PM data is collected and written to the flash memory 21, for example, at time intervals of 15 minutes. The PM data is then read out of the flash memory 21 and transmitted to the network management system 2, for example, at time intervals of 24 hours. Then, the network management system 2 manages and analyzes the state of the network according to the PM data.

The network device 1 is normally supposed to continually operate over five to ten years. In the meantime, approximately 35,000 writes are made to the PM data area of the flash memory 21 per year in the above described example. The number of writes (or the number of erase/write cycles) of the flash memory 21 is limited, and is 100,000 in this example. Accordingly, the data recording system according to the embodiment has a function to count the number of data writes to the flash memory 21, and to output an alarm if the number of writes exceeds a threshold value.

Figure 5:
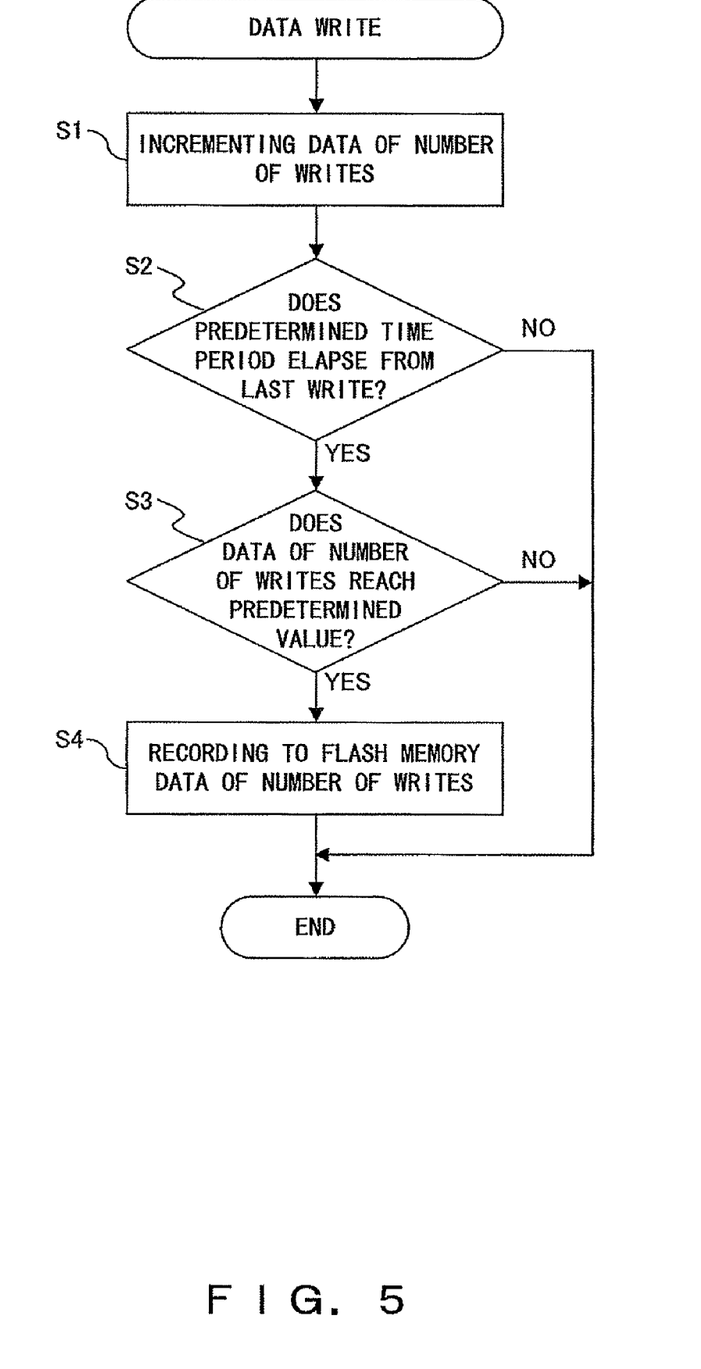
FIG. 5 is a flowchart showing procedures for recording, to a flash memory, data of the number of writes.

FIG. 5 is a flowchart showing procedures for recording, to the flash memory 21, the data of the number of writes. The procedures of this flowchart are executed by the CPU 24 each time a data write to the flash memory 21 occurs. Assume that "data writes" include not only a write of PM data but also a write of any data. Also assume that the limit number of writes to the flash memory 21 is 100,000.

In step S1, a "write count value" as the data of the number of writes is incremented. The latest write count value is held by the working RAM 23. In step S2, a time elapsed from when the data of the number of writes is lastly written to the flash memory 21 till the current time is detected. Then, it is checked whether or not this elapsed time exceeds a predetermined time period (such as 24 hours).

If the elapsed time exceeds the predetermined time period, it is checked in step S3 whether or not the data of the number of writes reaches a predetermined value. By way of example, it is checked whether or not the data of the number of writes reaches 1000N (N=1, 2, 3, ... ). If the predetermined time period elapses ("YES" in step S2), and if the number of writes exceeds the predetermined number ("YES" in step S3), the data of the number of writes is recorded to a predetermined area of the flash memory 21 in step S4.

Here, as one example, there is a method for calculating "1000N" as follows: "N" in the predetermined value is written to a predetermined area, for example, by providing the predetermined area in the flash memory 21, by writing an initial value "1" to the predetermined area, and by adding "1" to the value obtained by referencing the data of this area when data of the number of writes is written, and 1000N is calculated by reading the value N stored in this area when the data of the number of writes is checked.

As another method for implementing step S3, it may compare the current data of the number of writes and data of the number of writes, which is written to the flash memory 21, and determine whether or not their difference is equal to or larger than a predetermined value such as 1,000.

With the above described procedures, the data of the number of writes is basically recorded to the flash memory 21 only once if a predetermined time period elapses and if 1,000 or more data writes are made to the flash memory 21. Namely, with the above described procedures, the frequency at which the data of the number of writes is recorded to the flash memory 21 becomes low. Accordingly, the number of data writes to the flash memory 21 can be reduced as a whole, thereby extending the lifetime of the flash memory 21. In other words, a time period (the amount of time) leading up to the limitation on the number of writes to a memory can be extended while the number of writes is being managed with the use of the memory to be managed.

Additionally, the data of the number of writes is recorded to the flash memory 21, which is a nonvolatile memory, in the configuration shown in FIG. 4. Therefore, the data of the number of writes is held even if the working RAM 23 and the CPU 24 are reset due to an occurrence of a fault, etc.

The CPU 24 checks whether or not the number of data writes to the flash memory 21 reaches a threshold value by referencing the data of the number of writes, which is recorded to the flash memory 21, for example, periodically. Here, the data of the number of writes is written by 100 times while 100,000 data writes are being made to the flash memory 21. Accordingly, the threshold value is set to, for example, "99,900". If the value of the data of the number of writes exceeds the threshold value, the CPU 24 outputs an alarm. The alarm is implemented, for example, by making an LED light up, or by making a notification to the network management system 2. With this alarm, a system administrator can recognize the need for replacing the flash memory 21.

Second Embodiment

Figure 6:
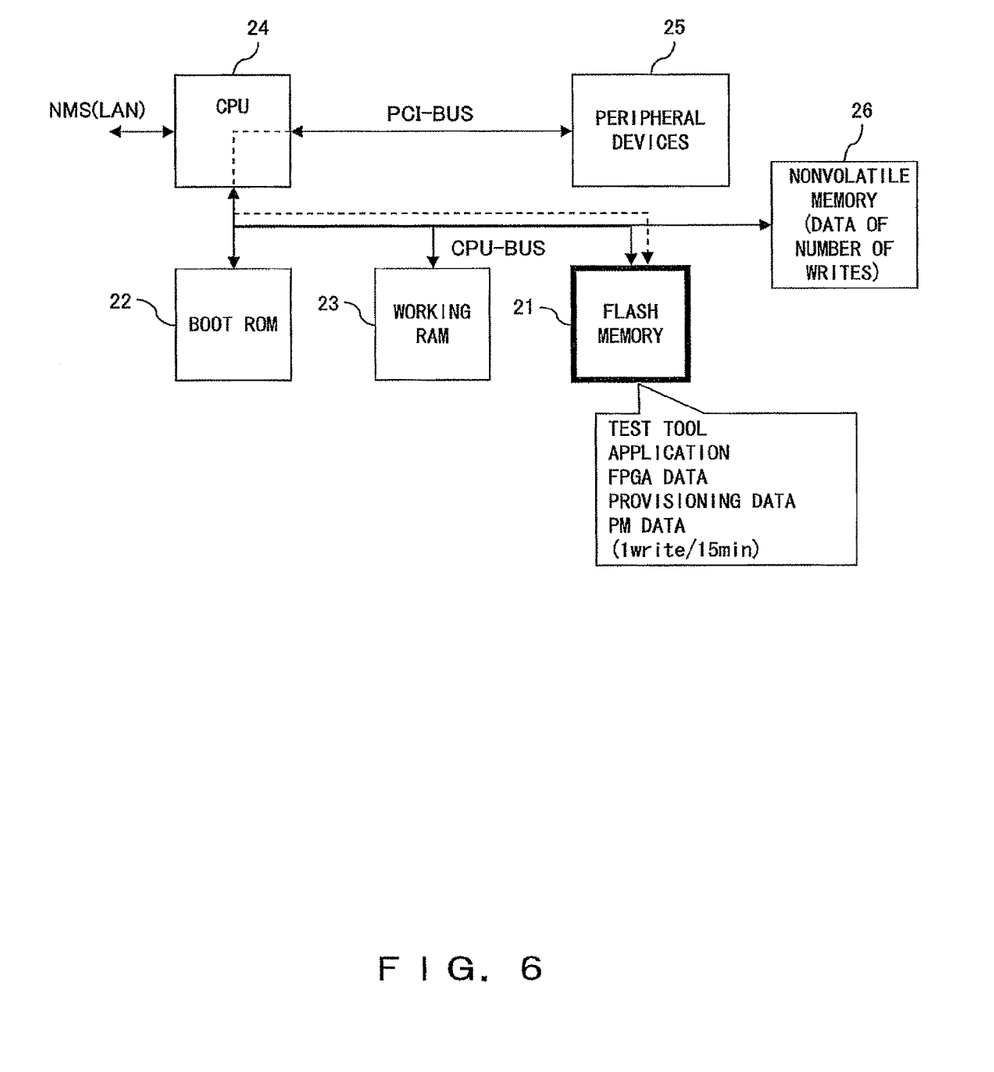
FIG. 6 shows a configuration of a data recording system according to a second embodiment.

FIG. 6 shows a configuration of a data recording system according to a second embodiment. In the second embodiment, data of the number of writes is recorded not to a flash memory 21 but to another nonvolatile memory 26. The use frequency of the nonvolatile memory 26 is sufficiently low compared with the flash memory 21 in this embodiment. Accordingly, in the second embodiment, the frequency at which the data of the number of writes is recorded may be increased compared with the first embodiment shown in FIG. 4. Namely, the data of the number of writes may be recorded to the nonvolatile memory 26 once, for example, each time 100 data writes are made to the flash memory 21.

In the second embodiment, a parameter for managing the number of data writes of the flash memory 21 in the first embodiment is saved not in the flash memory 21 to be managed but in another nonvolatile memory, and a save operation is similar to the first embodiment.

Third Embodiment

Figure 7:
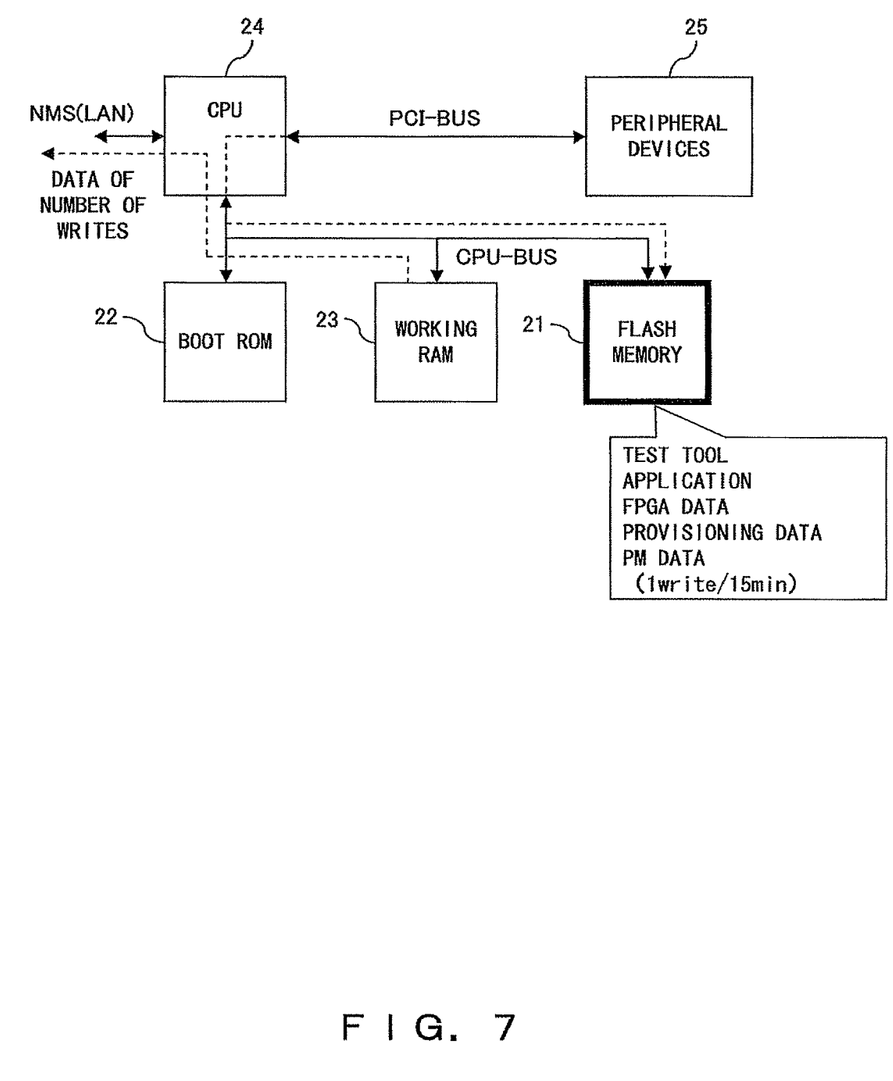
FIG. 7 shows a configuration of a data recording system according to a third embodiment.

FIG. 7 shows a configuration of a data recording system according to a third embodiment. In the third embodiment, data of the number of writes is periodically transmitted from a CPU 24 to a network management system 2 without being recorded in the flash memory 21. Here, the data of the number of writes may be transmitted by request made from the network management system 2, or the CPU 24 may autonomously transmit the data of the number of writes. Then, the network management system 2 outputs an alarm if the data of the number of writes exceeds a threshold value.

Fourth Embodiment

Figure 8:
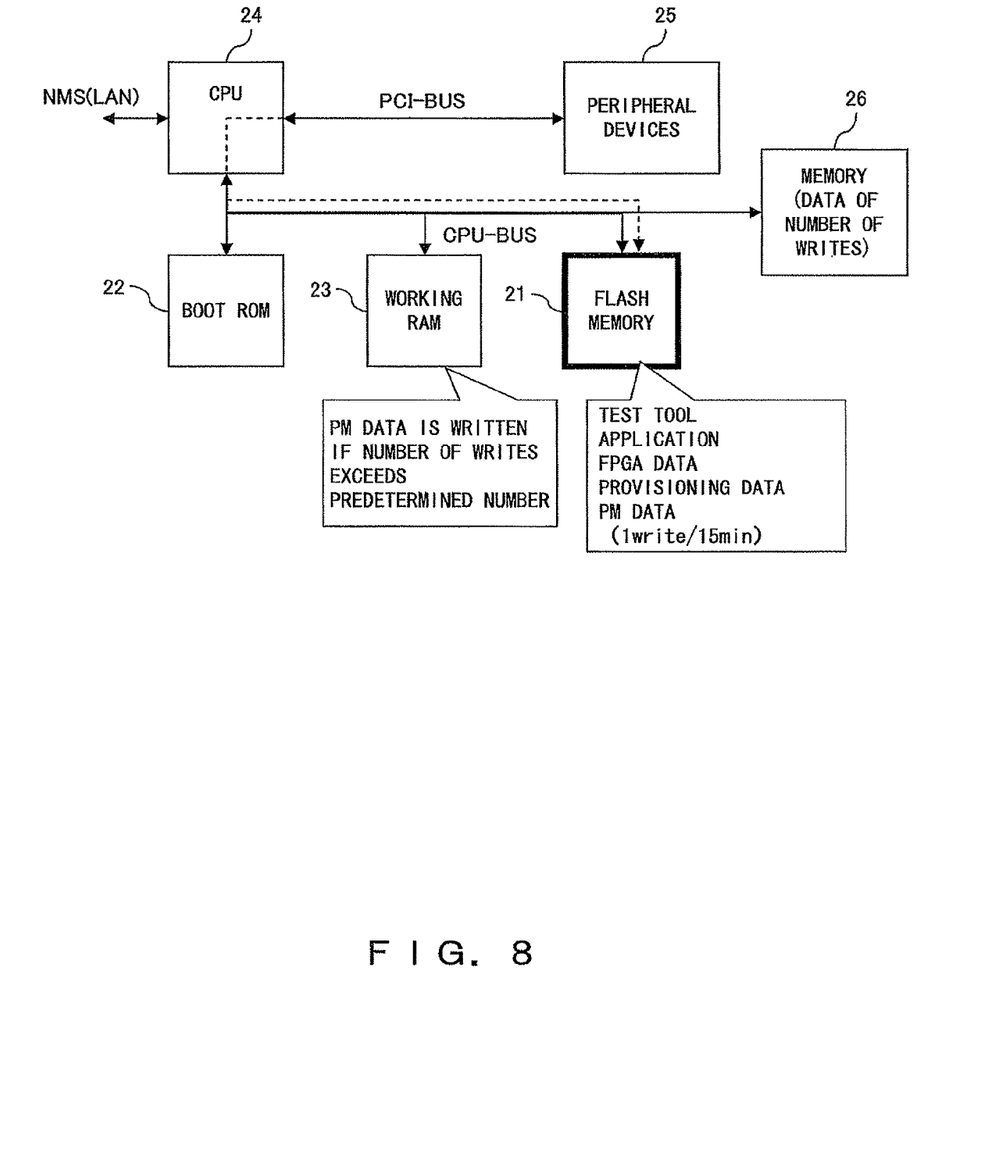
FIG. 8 shows a configuration of a data recording system according to a fourth embodiment.

FIG. 8 shows a configuration of a data recording system according to a fourth embodiment. In the fourth embodiment, data of the number of writes is recorded to the flash memory 21 or the nonvolatile memory 26. A method for recording, to the flash memory 21, the data of the number of writes is the same as the first embodiment, whereas a method for recording, to the nonvolatile memory 26, the data of the number of writes is the same as the second embodiment. In FIG. 8, the data of the number of writes is recorded to the nonvolatile memory 26.

A CPU 24 checks whether or not the number of data writes to the flash memory 21 reaches a threshold value by periodically referencing the data of the number of writes, which is recorded to the flash memory 21 or the nonvolatile memory 26. This threshold value is smaller than the limit number of writes of the flash memory 21. Namely, if the limit number of writes of the flash memory 21 is 1000,000, for example, "90,000" is set as the threshold value.

If the number of data writes to the flash memory 21 reaches this threshold value, the CPU 24 changes a location, to which the PM data is to be written, from the flash memory 21 to the working RAM 23. Namely, after the number of data writes to the flash memory 21 reaches this threshold value, the PM data is written to the working RAM 23. Therefore, the CPU 24 reads the PM data out of the working RAM 23, and transfers the read PM data to the network management system 2.

With this configuration, if the number of data writes to the flash memory 21 approaches the limit number of writes, the PM data is not written to the flash memory 21 thereafter. Here, the PM data is frequently written to a memory (for example, every 15 minutes). Therefore, the lifetime of the flash memory 21 can be extended. As a result, PM data of a low degree of importance is written to the working RAM 23 that is a volatile memory, whereas other important items of data (such as the update of a database, a change in an application program, and the like) are written to the flash memory 21 that is a nonvolatile memory. Namely, important data can be protected even if a power supply is stopped due to an occurrence of a fault, etc.

Fifth Embodiment

Figure 9:
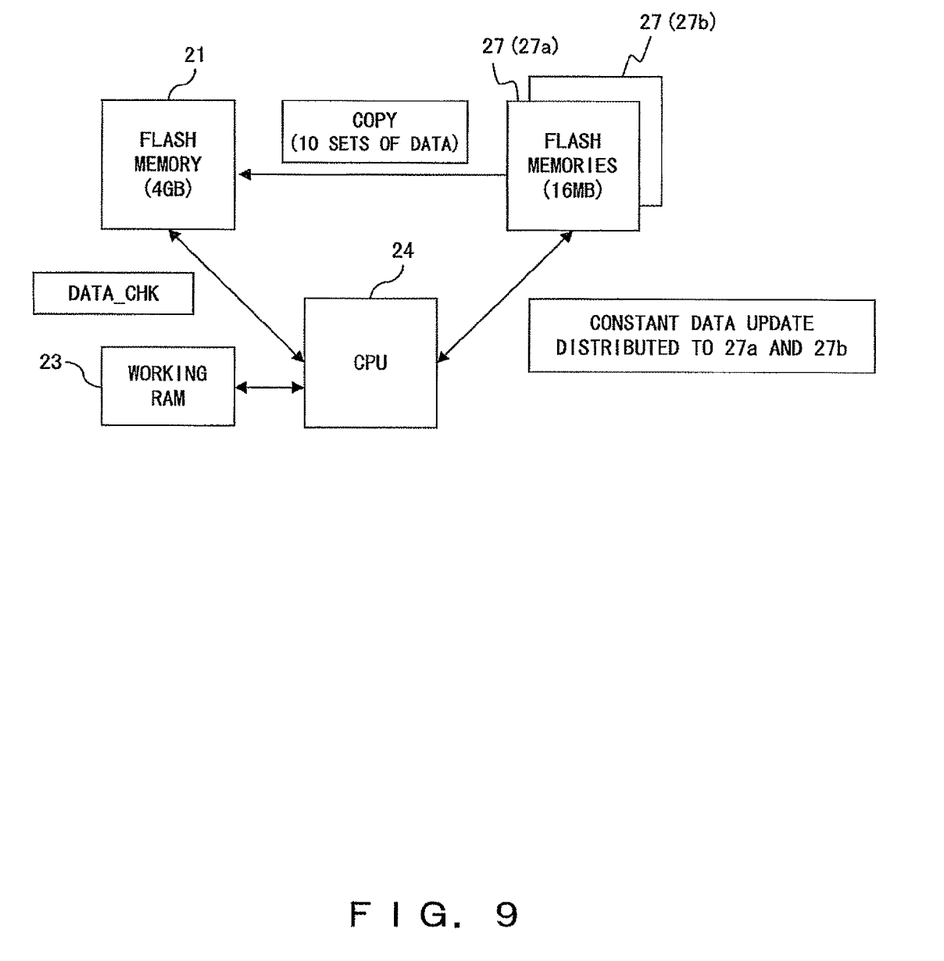
FIG. 9 shows a configuration of a data recording system according to a fifth embodiment.

FIG. 9 shows a configuration of a data recording system according to a fifth embodiment. In the fifth embodiment, the data recording system comprises flash memories 21 and 27 as memory devices. The flash memory 21 is the above described large-capacity memory, whereas the flash memory 27 is a small-capacity memory.

In the system having the above described configuration, a CPU 24 writes collected PM data to the flash memory 27. Then, the PM data accumulated in the flash memory 27 is periodically transferred to the flash memory 21. Here, assume that the capacity of the flash memory 27 is 16 MB, and 1 set of PM data is 1 MB. In this case, PM data is transferred to the flash memory 21, for example, each time 10 sets of PM data are accumulated in the flash memory 27.

Introducing this configuration reduces the number of data writes to the flash memory 21 to one-tenth of the configuration in which the flash memory 27 is not comprised. Namely, the lifetime of the flash memory 21 can be dramatically extended. With this configuration, however, the number of data writes to the flash memory 27 cannot be reduced. Namely, the lifetime of the flash memory 27 is not extended. However, the flash memory 27 is a small-capacity memory and low-cost. Therefore, the flash memory 27 can be replaced at significantly low cost compared with the replacement of the flash memory 21.

In the above described configuration, a plurality of flash memories 27 (#1, #2, . . . ) may be provided in a redundant manner. If the number of flash memories 27 is suitably determined in consideration of the scheduled running period of the network device 1, an operation for replacing the flash memory 27 never occurs while the network device 1 is running. Assume that the limit number of writes of each of the flash memories 27 is 100,000, the number of writes of PM data is 35,000 per year, and the scheduled running period of the network device 1 is ten years. In this case, providing four flash memories 27 beforehand eliminates the need for replacing the flash memory 27.

When a plurality of sets of PM data are transferred from the flash memory 27 to the flash memory 21, sequence numbers may be respectively attached to the PM data. For example, values from 1 to 256 are used as the sequence numbers. Introducing this configuration enables data to be surely retransmitted even if an error occurs in the data transfer from the flash memory 27 to the flash memory 21. Additionally, which set of PM data is available can be detected in the flash memory 21 if the system is restarted after a power supply is stopped.

Figure 10:
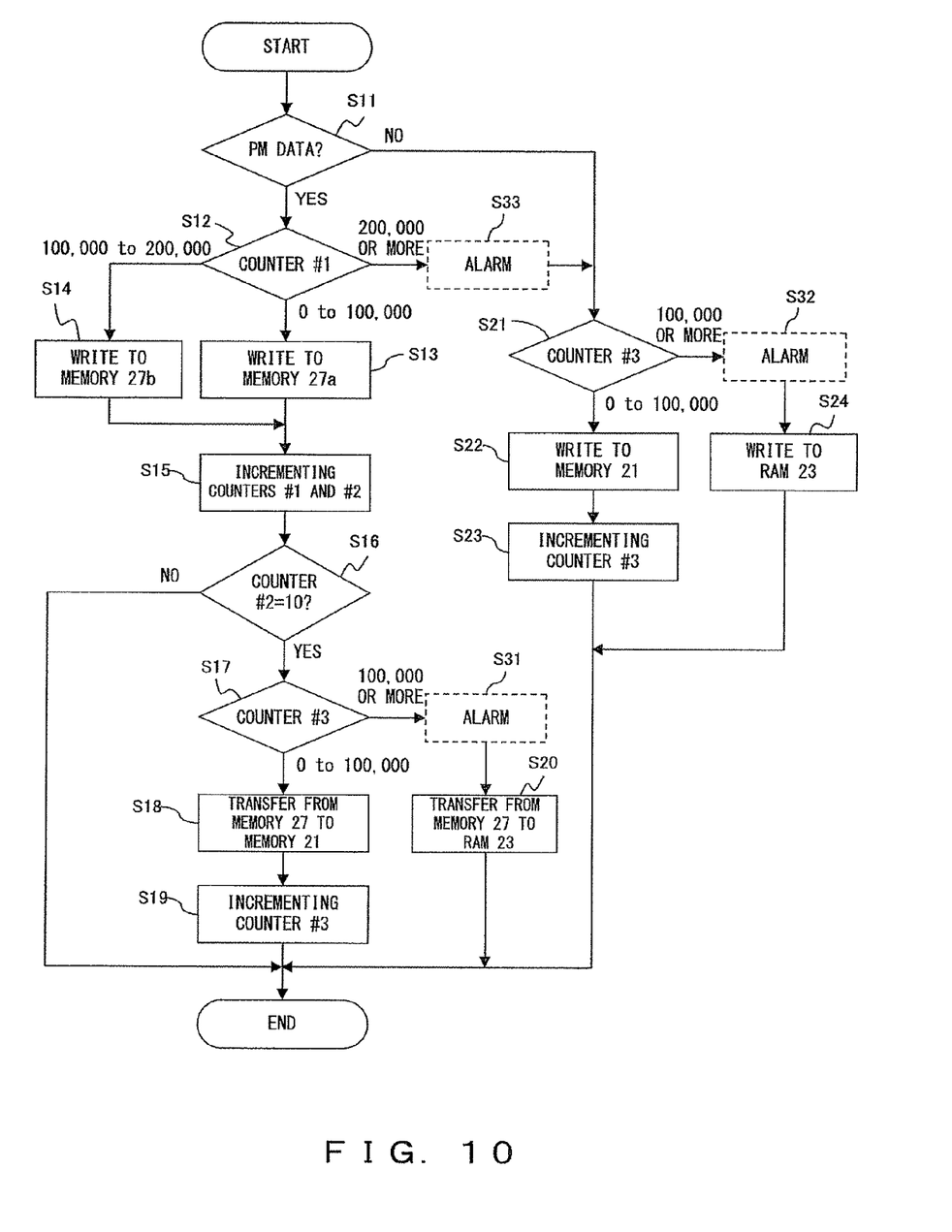
FIG. 10 is a flowchart showing a data recording method in the fifth embodiment.

FIG. 10 is a flowchart showing a data recording method in the fifth embodiment. Procedures of this flowchart are executed by the CPU 24 each time a data write to a nonvolatile memory occurs. Here, assume that two flash memories 27 (27a and 27b) are provided in the system shown in FIG. 9. Also assume that the limit numbers of writes of the flash memories 21 and 27 are 100,000, respectively.

The CPU 24 provides counters #1 to #3 for counting the number of data writes. Each of the write counters #1 and #2 counts the number of data writes to the flash memory 27. Note that, however, the write counter #2 cyclically counts values from 1 to 10. The write counter #3 counts the number of data writes to the flash memory 21. Data writes to the flash memory 21 are assumed to include a data transfer from the flash memory 27 to the flash memory 21.

In step S11, it is checked whether or not data to be written to a nonvolatile memory (the flash memory 21, the flash memory 27a or the flash memory 27b) is PM data. If the data to be written to the nonvolatile memory is the PM data, the count value of the write counter #1 is checked in step S12. If the count value is smaller than "100,000", the given PM data is written to the flash memory 27a in step S13. If the count value is equal to or larger than "100,000" and smaller than "200,000", the given PM data is written to the flash memory 27b in step S14. If the count value is equal to or larger than "200,000", the process proceeds to step S21. Also if the data to be written to the nonvolatile memory is not the PM data, the process proceeds to step S21.

After the PM data is written to the flash memory 27 (27a or 27b), the write counters #1 and #2 are respectively incremented in step S15. Then, in step S16, the count value of the write counter #2 is checked. If this count value is "10", the process proceeds to step S17. If the count value is not "10", the process is terminated. Namely, if the count value of the write counter #2 is not "10", the PM data is written only to the flash memory 27, and a data transfer from the flash memory 27 to the flash memory 21 is not made.

In step S17, the count value of the write counter #3 is checked. If the count value is smaller than "100,000", PM data held in the flash memory 27 (27a or 27b) is transferred to the flash memory 21 in step S18. Then, in step S19, the write counter #3 is incremented. When the above described data transfer is made, the flash memory 27 (27a or 27b) is cleared. Or, if the count value of the write counter #3 is equal to or larger than "100,000", the PM data held in the flash memory 27 (27a or 27b) is transferred to the working RAM 23 in step S20.

If the data to be written to the nonvolatile memory is not the PM data, or if the count value of the write counter #1 is equal to or larger than "200,000", operations of steps S21 to S24 are executed. The operations of steps S21 to S24 are similar to steps S17 to S20. However, input data is written to the flash memory 21 not via the flash memory 27 in step S22. Similarly, input data is written to the working RAM 23 not via the flash memory 27 in step S23.

If the count value of the write counter #3 is equal to or larger than "100,000", an alarm for prohibiting a data write to the flash memory 21 may be output (steps S31 and S32). In addition, if the count value of the counter #1 is equal to or larger than "200,000", an alarm for prohibiting a data write to the flash memory 27 may be output (step S33).

Since the number of data writes to the flash memory 21 becomes small in the fifth embodiment as described above, the lifetime of the flash memory 21 is extended.

The present invention produces the following effects when being used in a network device although it is not limited to a configuration used in the network device. Namely, a plurality of cards (such as ten or more cards) are normally included in a network device, and a memory having a limitation on the number of writes is mounted on each of the cards. The number of writes to a memory can possibly reach a threshold value on the plurality of cards in the same time period. However, all of the cards cannot be simultaneously replaced to prevent a service rendered to a client from being stopped. Accordingly, if the timing when a memory becomes unavailable can be recognized beforehand by using the function of the embodiments of the present invention, maintenance operations can be performed in a well-planned manner before a memory fault occurs. As a result, the quality of a service can be prevented from being degraded. Especially, in a large-scale system comprising many network devices, the number of cards (namely, the number of memories) to be managed is large, and the length of time required to restore faults becomes long if many memory faults occur at the same time.

Therefore, introducing the system of the embodiments of the present invention can implement efficient maintenance/management.

Note that the present invention is related not only to a nonvolatile semiconductor memory, and applicable to a data recording system comprising various types of memory devices having a limitation on the number of writes.

What is claimed is:

1. A data recording system, comprising:
   a first memory;
   a counting unit to count a number of data writes to the first memory; and
   an alarm unit to output an alarm if the number of data writes to the first memory reaches a first threshold value, wherein
   the counting unit writes data of the number of writes, which represents the number of data writes to the first memory, to the first memory or a second memory each time a predetermined condition is satisfied, and
   the alarm unit outputs an alarm based on the data of the number of writes, the data of the number of writes being written to the first memory or the second memory.

2. The data recording system according to claim 1, wherein
   the counting unit writes, to the first memory or the second memory, the data of the number of writes each time a predetermined number of data writes is made to the first memory.

3. The data recording system according to claim 1, wherein
   the counting unit writes, to the first memory or the second memory, new data of the number of writes when a predetermined time period elapses from when last data of the number of writes is written to the first memory or the second memory.

4. The data recording system according to claim 1, further comprising
   a write control unit for writing, to a third memory, data to be written to the first memory if the number of data writes to the first memory reaches a second threshold value.

5. A data recording system, comprising:
   a first memory;
   a second memory including a capacity of which is smaller than the first memory;
   a counting unit to count a number of data writes to the second memory;
   a transfer unit to transfer data, which is stored in the second memory, to the first memory each time a predetermined number of data writes is made to the second memory,
   a write control unit to write, to the first memory or the second memory, data to be recorded to a memory according to an attribute of the data; and
   an alarm unit to output an alarm when a sum of the number of data writes to the first memory and the number of data transfers, which are made by the transfer unit, from the second memory to the first memory reaches a threshold value.

6. The data recording system according to claim 5, wherein the second memory is configured in a redundant manner.

7. A method for controlling a data write to a nonvolatile memory of a data recording system, comprising:
   counting a number of data writes to an auxiliary nonvolatile memory of the data recording system by a counting unit of the data recording system, a capacity of which is smaller than the nonvolatile memory;
   transferring data, which is stored in the auxiliary nonvolatile memory, to the nonvolatile memory by a transfer unit of the data recording system each time a predetermined number of data writes is made to the auxiliary nonvolatile memory;
   writing, to the nonvolatile memory or the auxiliary nonvolatile memory by a write control unit of the data recording system, data to be recorded to a memory according to an attribute of the data; and
   outputting an alarm by an alarm unit of the data recording system when a sum of the number of data writes to the nonvolatile memory and the number of data transfers, which are made by the transfer unit, from the auxiliary nonvolatile memory to the nonvolatile memory reaches a threshold value.

* * * * *